United States Patent [19]
Bartlett et al.

[11] Patent Number: 5,834,975
[45] Date of Patent: Nov. 10, 1998

[54] INTEGRATED VARIABLE GAIN POWER AMPLIFIER AND METHOD

[75] Inventors: James L. Bartlett, Cedar Rapids, Iowa; Mau Chung F. Chang, Thousand Oaks, Calif.; J. Aiden Higgins, Westlake Village, Calif.; Henry O. Marcy, 5th, Camarillo, Calif.; Deepak Mehrotra, Thousand Oaks, Calif.; Kenneth D. Pedrotti, Thousand Oaks, Calif.; David R. Pehlke, Thousand Oaks, Calif.; Charles W. Seabury, Calabasas, Calif.; J. L. Julian Tham, Irvine, Calif.; Jun J. Yao, Thousand Oaks, Calif.

[73] Assignee: Rockwell Science Center, LLC, Thousand Oaks, Calif.

[21] Appl. No.: 815,694

[22] Filed: Mar. 12, 1997

[51] Int. Cl.$^6$ .............................. H03G 3/30; H03F 3/68
[52] U.S. Cl. ........................ 330/278; 330/295; 330/307
[58] Field of Search ............................... 330/51, 124 R, 330/129, 278, 295, 302, 307

[56] References Cited

U.S. PATENT DOCUMENTS

| | | | |
|---|---|---|---|
| 4,598,252 | 7/1986 | Andricos | 330/124 R X |
| 4,755,769 | 7/1988 | Katz | 330/124 R X |
| 5,256,987 | 10/1993 | Kibayashi et al. | 330/295 |
| 5,578,976 | 11/1996 | Yao | 333/262 |

OTHER PUBLICATIONS

R. Dorf, *The Electrical Engineering Handbook*, CRC Press, 1993, pp. 1011–1013.

C.T. Wang, *Introduction to Semiconductor Technology*, John Wiley & Sons, 1990, pp. 67, 102, 187–213, 382–384, 422–433.

Krauss and Bostian, *Solid State Radio Engineering*, John Wiley & Sons, 1980, pp. 417–429, 472, 473.

Licari and Enlow, *Hybrid Microcircuit Technology Handbook*, Noyes Publications, 1988, pp. 76–77.

Yao and Chang, A Surface Micromachined Miniature Switch for Telecommunications Applications With Signal Frequencies From DC up to 4 GHZ, *In Tech. Digest*, Transducer–95, Stockholm, Sweden, Jun. 25–29, 1995, pp. 384–387.

*Primary Examiner*—Steven Mottola
*Attorney, Agent, or Firm*—Koppel & Jacobs

[57] ABSTRACT

An integrated, variable gain microwave frequency power amplifier comprises a number of individual amplifier stages which contain microwave frequency active devices. Each stage is fed with a common input signal, and the individual stage outputs are connected to respective microelectromechanical (MEM) switches which, when closed, connect the individual outputs together to form the power amplifier's output. The power amplifier's gain is determined by the number of outputs connected together. The preferred switch provides low insertion loss and excellent electrical isolation, enabling a number of amplifier stages to be efficiently interconnected to provide a wide dynamic range power amplifier. The switches are preferably integrated on a common substrate with the active devices, eliminating the need for wire bonds and reducing parasitic capacitances. A variable impedance network comprising a number of impedance matching networks selected using MEM switches can be connected to and integrated with a variable gain power amplifier to provide impedance matching that is appropriate for each of the power amplifier's possible output power levels.

35 Claims, 5 Drawing Sheets

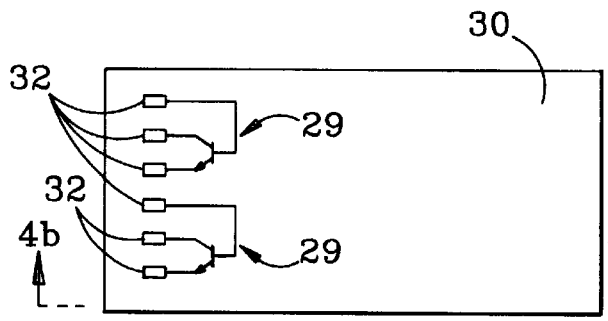
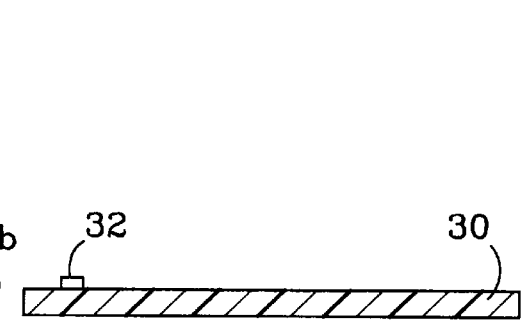
FIG.4a　　　　　　　FIG.4b
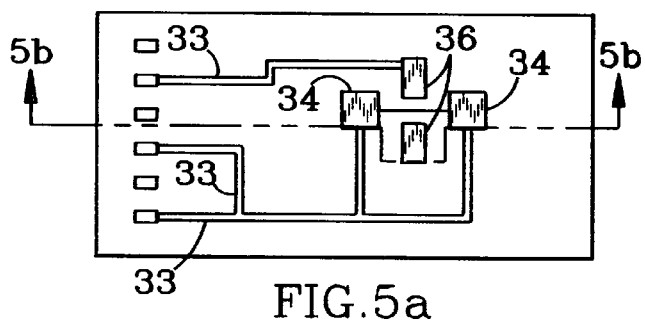
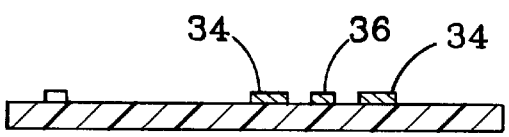
FIG.5a　　　　　　　FIG.5b
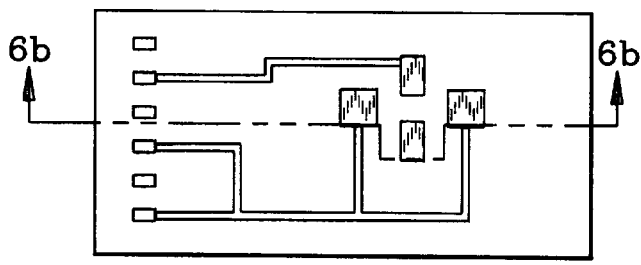
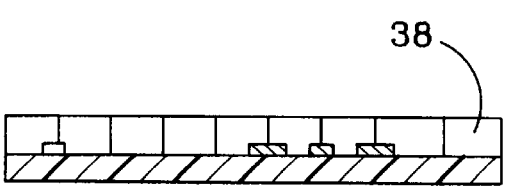
FIG.6a　　　　　　　FIG.6b
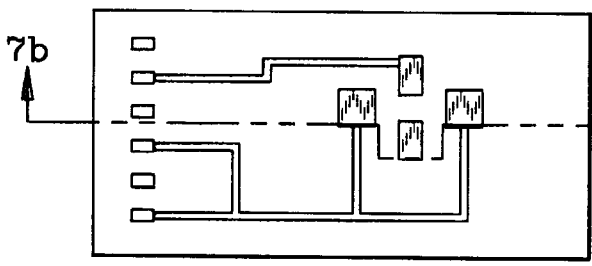
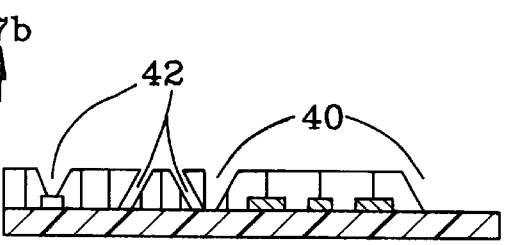
FIG.7a　　　　　　　FIG.7b

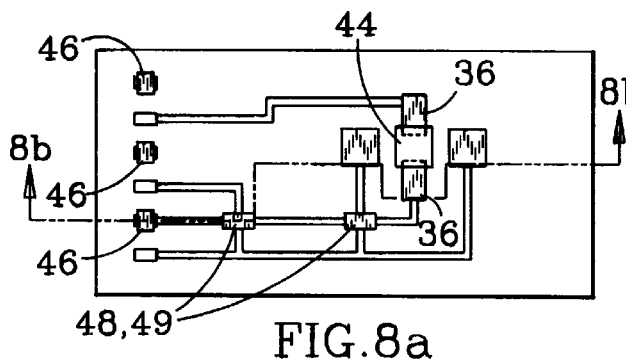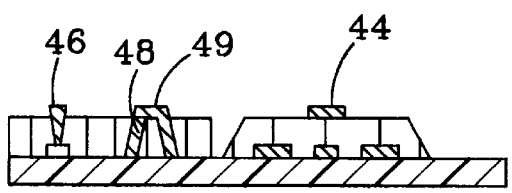
FIG.8a  FIG.8b
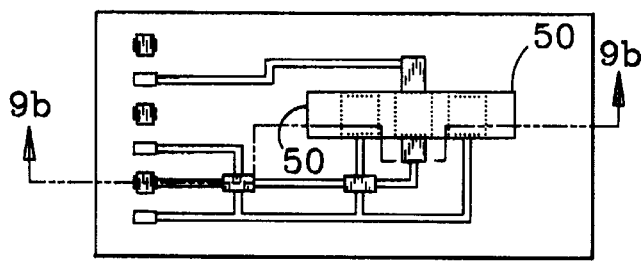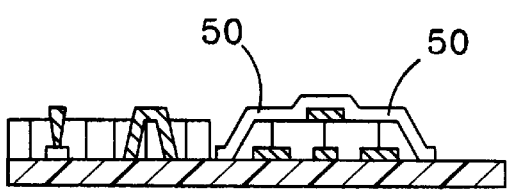
FIG.9a  FIG.9b
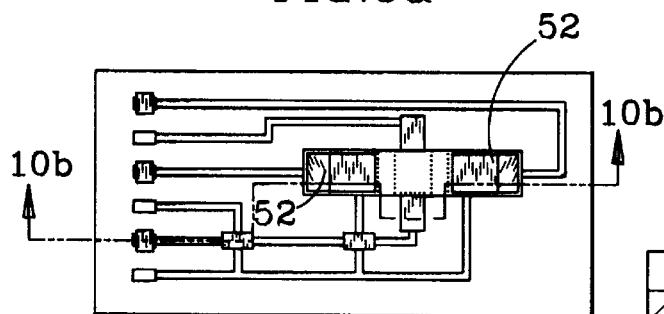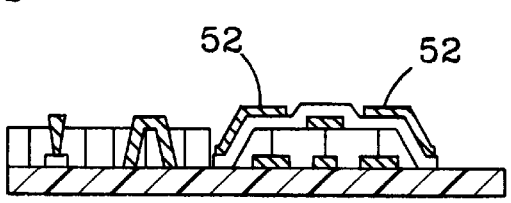
FIG.10a  FIG.10b
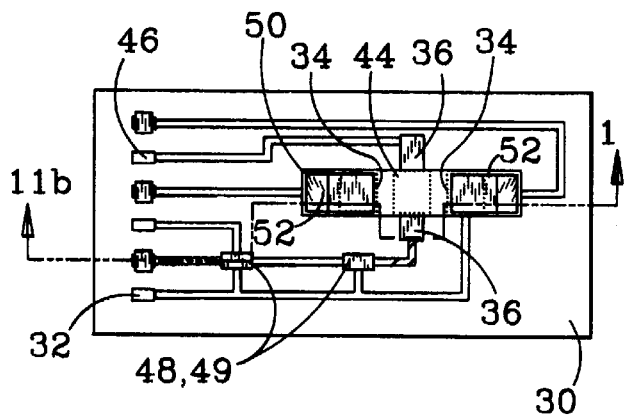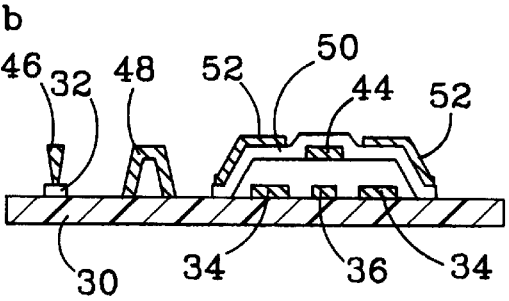
FIG.11a  FIG.11b

INTEGRATED VARIABLE GAIN POWER AMPLIFIER AND METHOD

BACKGROUND OF THE INVENTION

1. Field of the Invention

This invention relates to the fields of microelectromechanical (MEM) switches and power amplifiers, particularly those amplifiers operating at microwave frequencies and above.

2. Description of the Related Art

Power amplifiers are found in many types of telecommunications units, where they are typically used to amplify a signal prior to its delivery to an antenna for transmission. Some of these units, particularly battery-powered transceivers such as cellular phones, require the use of a power amplifier which has a variable gain. This feature enables a unit to conserve battery power by setting the transceiver's output power as low as possible to maintain a given communications link, and to comply with FCC regulations which mandate maximum output power levels.

Handheld transceivers typically operate in either the microwave (900 MHz–30 GHz) or millimeter wave (30–300 GHz) portions of the frequency spectrum. Several methods have been employed to achieve variable gain in power amplifiers operating at these frequencies. "Variable gain" as used herein refers to techniques of controlling a power amplifier so that it can deliver power at more than one output power level. One such technique is "drive modulation", in which the RF input to an amplifier is reduced in response to a modulating signal, and the reduced input in turn reduces the amplifier's output power level. This method works well in a Class A amplifier, but as the efficiency of a Class A amplifier decreases with output power, this technique is not desirable when efficiency is critical, as it is with battery-powered units. This drawback is applicable to a somewhat lesser degree in a Class B amplifier. Using drive modulation with inherently non-linear Class C and F amplifiers can result in large distortion products if more than a modest output power range is sought. Drive modulation is not recommended for use with switched amplifier modes D, E and S, because a reduced drive signal tends to turn the active devices from switches into current sources and the amplifier no longer operates as designed.

Another technique for varying an amplifier's output power is by controlling the supply voltage applied to it, typically designated $V_{cc}$. An amplifier's output power $P_{out}$ is given by the following equation:

$$P_{out} = K \times (V_{cc}^2 / R) \qquad \text{(Eq. 1)}$$

where K is a constant related to the amplifier class and R is the load resistance driven by the amplifier; output power increases with $V_{cc}^2$. This method works well for lower frequency applications but is troublesome at higher frequencies. When establishing the load resistance for an actual, non-ideal amplifier, the term $V_{cc}^2$ in the above equation must be modified to account for the saturation voltage or resistance of the device, i.e., $V_{cc}^2$ becomes $(V_{cc} - V_{ce(sat)})^2$, where $V_{ce(sat)}$ represents the collector-emitter saturation voltage for a bipolar transistor. At high frequencies, $V_{ce(sat)}$ is partly dependent on frequency, which results in saturation levels that change non-linearly, and thus to changes in efficiency. At very low levels of $V_{cc}$, input RF power can exceed the output RF power which can be supported by the $V_{cc}$ and R presented to the amplifier; in this case, input power must be either dissipated as heat or transferred out of the amplifier in some form, such as harmonic currents, reflections back to the source, or heating in the device.

Another technique for implementing a high frequency variable gain power amplifier involves the use of switches. For example, a switch can be used to bypass a high power output stage, or to connect differing numbers of active devices or amplifier stages together to provide different output power levels. However, there are several problems related to the use of state of the art solid-state switches at microwave frequencies and above, which are typically implemented with gallium arsenide (GaAs) MESFETs or PIN diode circuits. At signal frequencies of about 900 MHz and above, these switching devices or circuits typically exhibit an insertion loss in the 'ON' (closed) state of about 1 db, and provide poor electrical isolation in the 'OFF' (open) state of about –30 db. These shortcomings practically limit the number of active devices or stages that can be connected together to about three, beyond which the losses incurred by the switches becomes unacceptably high. Additional gain must often be built into the amplifier, or additional amplifiers inserted, to compensate for the poor performance of the devices, increasing power dissipation, cost and increasing unit size and weight. The characteristics of GaAs MESFETs and PIN diode switches are discussed, for example, in R. Dorf, *The Electrical Engineering Handbook*, CRC Press (1993), pp. 1011–1013.

Providing switching with PIN diode circuits presents additional problems due to the parasitic capacitances inherently created by their use, which serve to limit the frequency range over which the amplifier can operate. Similar problems arise when the necessary switching is provided by discrete, off-chip switches, due to the parasitic inductances that result from the presence of wire bonds. Off-chip switching also tends to add bulkiness and cost to an amplifier.

In order to realize an efficient transfer of power from an active device to the load it is driving, an impedance matching network is typically interposed between them, which serves to establish the value of load resistance R being driven by the device. For example, given a $V_{cc}$ of 36 volts, a K of 0.506 (for a Class C saturating amplifier) and a desired output power of 150 watts, the impedance at the active device is determined from equation (1) above (rearranged to solve for R) as follows:

$$R = 0.506 \times (36^2 / 150) = 4.37 \text{ ohms.}$$

Since the standard RF output impedance is 50 ohms, a properly designed matching network transforms the 4.37 ohms at the active device to 50 ohms, which enables an efficient transfer of the full 150 watts to the load. Connecting the 50 ohm output load to the device without a matching network, or with a network which provides a poor match, can result in lower output power, poor gain, poor efficiency, instability, oscillations and increased stresses on the active device. Impedance matching is discussed, for example, in C. T. Wang, *Introduction to Semiconductor Technology*, John Wiley & Sons (1990), pp. 382–384.

An impedance matching network provides efficient power transfer at a single output power level. A variable gain amplifier, i.e., one capable of providing more than one output power level, typically has an impedance that varies with the power level, and thus presents an impedance matching problem. Unless the matching impedance can be made to vary, some degree of mismatch will occur at some output power levels.

SUMMARY OF THE INVENTION

An integrated, variable gain power amplifier is presented that overcomes the problems noted above, providing previously unattainable levels of performance in units that are smaller, lighter and cheaper than those found in the prior art.

The present power amplifier is made from a number of amplifier stages having respective outputs which are interconnected with a number of switches. The amplifier stages are comprised of RF active devices, which can include microwave frequency active devices (i.e., active devices that are functional at microwave frequencies and above), with each stage fed with a common input signal. The individual stage outputs are connected to respective microelectromechanical (MEM) switches which selectively connect the individual outputs together to form the power amplifier's output. The power amplifier's gain and power output capability is determined by the number of outputs connected together. For example, a four-stage power amplifier in which the gain and power output (P) of each stage is equal, can provide an overall power output of P, 2P, 3P or 4P by simply closing one, two, three or four switches, respectively.

The novel use of MEM switches in conjunction with RF active devices provides many advantages, particularly at microwave frequencies and above. The preferred switch operates by bridging a gapped signal line with a gold contact (closing the switch), providing a very low insertion loss of about 0.1 dB; lifting the contact (switch open) gives an excellent electrical isolation specification of about −50 dB. Because these performance specifications are far superior to those provided by state of the art solid state switches, more amplifier stages can be efficiently interconnected than has heretofore been practical, resulting in a wide dynamic range power amplifier that offers an unprecedented amount of gain control.

The invention provides another significant advantage in that the switches and the active devices may be integrated together on a common substrate. This eliminates the need for wire bonds and largely eliminates frequency range-reducing parasitic reactances, thus making efficient variable gain and power output operation into the millimeter wave portion of the spectrum feasible. Integration also enables the production of communication units which are smaller, lighter and more reliable than prior art designs.

For efficient operation, most power amplifiers operating at high frequencies require a matching impedance network to be connected between their output and the load being driven. The invention also presents a variable impedance matching scheme which includes a number of matching networks which, using MEM switches, are connected to the output of a variable gain amplifier and interconnected as necessary to provide impedance matching that is appropriate for the amplifier's output levels. The impedance matching networks and associated MEM switches are preferably integrated on the same substrate as the variable gain amplifier to provide an integrated variable gain, variable impedance matching RF power amplifier.

Further features and advantages of the invention will be apparent to those skilled in the art from the following detailed description, taken together with the accompanying drawings.

BRIEF DESCRIPTION OF THE DRAWINGS

FIG. 4a is a plan view showing a method of integrating microwave frequency active devices and MEM switches per the present invention.

FIG. 4b is a sectional view which corresponds with the plan view of FIG. 4a.

FIG. 5a is a plan view showing a successive step of the integration method of FIG. 4a.

FIG. 5b is a sectional view which corresponds with the plan view of FIG. 5a.

FIG. 6a is a plan view showing a successive step of the integration method of FIG. 4a.

FIG. 6b is a sectional view which corresponds with the plan view of FIG. 6a.

FIG. 7a is a plan view showing a successive step of the integration method of FIG. 4a.

FIG. 7b is a sectional view which corresponds with the plan view of FIG. 7a.

FIG. 8a is a plan view showing a successive step of the integration method of, FIG. 4a.

FIG. 8b is a sectional view which corresponds with the plan view of FIG. 8a.

FIG. 9a is a plan view showing a successive step of the integration method of FIG. 4a.

FIG. 9a is a sectional view which corresponds with the plan view of FIG. 9a.

FIG. 10a is a plan view showing a successive step of the integration method of FIG. 4a.

FIG. 10b is a sectional view which corresponds with the plan view of FIG. 10a.

FIG. 11a is a plan view showing a successive step of the integration method of FIG. 4a.

FIG. 11b is a sectional view which corresponds with the plan view of FIG. 11a.

DETAILED DESCRIPTION OF THE INVENTION

Figure 1:
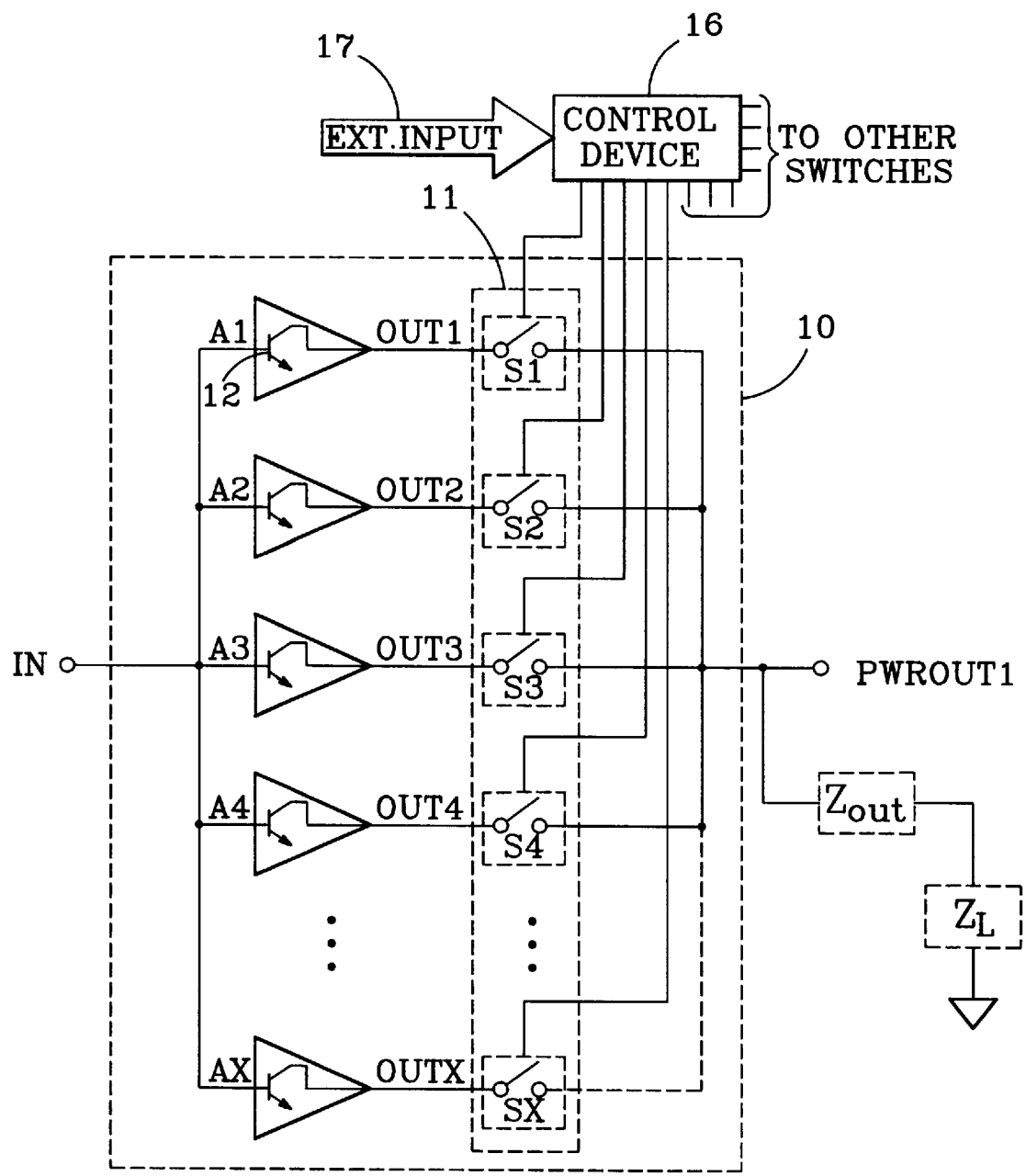
FIG. 1 is a schematic diagram of an embodiment of a variable gain power amplifier per the present invention.

As shown in FIG. 1, a power amplifier 10 comprises a number X of amplifier stages A1, A2, . . . , AX which are connected to a common input signal IN, and have respective outputs OUT1, OUT2, . . . , OUTX. The outputs are connected to a switching network 11 which serves to selectively connect the outputs together to form the power amplifier's output PWROUT1. The switching network is preferably configured to connect the outputs of between zero and X stages together to create PWROUT1, as does the switching network comprising switches S1, S2, . . . , SX shown in FIG. 1. Output PWROUT1 is typically connected to an impedance matching network $Z_{out}$ which is in turn connected to a load having an impedance $Z_L$. Switches S1, S2, . . . , SX are preferably micro-electromechanical (MEM) switches. A MEM switch as used herein refers to a device having a movable metal contact which bridges a gapped circuit path when made to move from an "open" position to a "closed" position, typically in response to the application of an actuation voltage, and which can be implemented on an I.C. substrate using well-known I.C. fabrication techniques.

The amplifier stages A1, A2, . . . , AX have respective gains G1, G2, . . . , GX, and the overall gain $G_{total}$ of power amplifier 10 is equal to the sum of the individual gains of the stages connected to contribute to PWWROUT1. For example, if MEM switches S1 and S2 are closed with all other switches open, $G_{total}$=G1+G2. A gain of zero is achieved when all the MEM switches are open, so that the gain of X-stage power amplifier 10 can range between zero and G1+G2+ . . . +GX.

The power amplifier 10 is intended for implementation as an integrated circuit. Fabricating the active devices so that they have similar characteristics provides a power amplifier which offers a discrete number of gain levels equal to the number of stages X, plus one (for zero gain). It is not essential, however, that the stages have equal gains, and a power amplifier in which each stage has a unique gain provides more discrete gain steps than does one with equal gains. An X-stage power amplifier in which each stage has a unique gain can have as many as $2^x$ discrete gain levels (plus one for zero gain). The benefits provided by this approach may be offset by added fabrication complexity and impedance matching difficulties (discussed below), however.

The preferred switches S1, S2, . . . , SX are MEM switches due to their superior insertion loss and electrical isolation characteristics (typically about 0.1 dB and -50 dB, respectively), their ability to function at 900 MHz and above, and because they may be easily integrated with microwave frequency active devices, making an integrated variable gain microwave power amplifier realizable. These performance characteristics dramatically reduce the limitations on power amplifier design imposed by prior art solid state switches.

The preferred MEM switch has at least one top electrode positioned on a cantilever arm which extends over at least one bottom electrode positioned on an I.C. substrate. When an actuation voltage is applied across the top and bottom electrodes, the cantilever arm is electrostatically drawn toward the substrate and a contact electrode affixed to the substrate side of the cantilever arm bridges a gap in a signal line on the substrate surface, creating a continuous signal path. MEM switches as discussed herein are discussed in Yao and Chang, "A Surface Micromachined Miniature Switch for Telecommunications Applications with Signal Frequencies from DC up to 4 GHz," In Tech. Digest (1995), pp. 384–387 and in U.S. Pat. No. 5,578,976 to Yao, which is assigned to the same assignee as the present application.

The individual amplifier stages A1, A2, . . . , AX are comprised of active devices 12 which are typically used in conjunction with passive components. The invention's benefits are best realized at high frequencies at which microwave frequency active devices must be used; amplifier stages based on heterojunction bipolar transistors (HBTs) 12 (shown in FIG. 1) are preferred for signal frequencies between about 900 MHz and 10 GHz, and alternatively, pseudomorphic high electron mobility transistors (PHEMTs) 14 (shown in the embodiment of FIG. 2, discussed below) are preferred at signal frequencies between about 10 GHz and 80 GHz. HBTs and PHEMTs are preferably fabricated on a GaAs substrate, and the preferred MEM switches can be fabricated on GaAs, silicon, glass and other insulating substrates, which allows the switches and the amplifier stages to be fabricated on a common substrate with common processing steps (described in detail below). The unprecedented integration of microwave frequency active devices and high performance switches results in the realization of a microwave frequency power amplifier having unparalleled performance in terms of power density, reliability and low cost. The characteristics and fabrication of HBTs are discussed, for example, in C. T. Wang, *Introduction to Semiconductor Technology*, supra, pp. 187–213. PHEMTs are discussed, for example, in C. T. Wang, *Introduction to Semiconductor Technology*, supra, pp. 67 and 102.

Amplifier stages comprised of conventional bipolar junction transistors (BJTs) or FETs are acceptable for signal frequencies below 900 MHz, and a power amplifier made from such stages interconnected with MEM switches would still benefit from the superior performance characteristics of the switches.

The individual amplifier stages are not limited to any particular class or design, which is properly selected based on system requirements such as output power, frequency range, efficiency, linearity and heat dissipation capability. For example, class A amplifier stages will provide good linearity and a broad bandwidth, but also have low efficiencies (well under the theoretical maximum of 50%, typically) and high dissipation requirements. Class C stages provide reasonably high efficiencies (45%–65%, typically), but suffer from non-linearity and a somewhat narrower frequency range than does a class A stage. The essential characteristics of various amplifier classes are discussed, for example, in Krauss and Bostian, *Solid State Radio Engineering*, John Wiley and Sons (1980), pp. 472–473.

The switching network 11 for power amplifier 10 is preferably controlled by a control device 16. As noted above, the preferred MEM switches are operated by applying an actuation voltage across their top and bottom electrodes. Control device 16 is preferably connected to each switch in the network 11 and applies actuation voltages as necessary to obtain a desired power output level. Control device 16 preferably includes a computer or microprocessor which receives an external input signal 17 that represents a desired power output level (from another circuit or a manual entry device, for example), and is configured or programmed to close the switches necessary to achieve the desired output.

An impedance matching network is typically interposed between a power amplifier's output and the load it is driving, which, when properly designed reduces signal reflections and degradation caused by impedance mismatch. The proper design of such a network is dependent on the power level of the amplifier's output, which as noted above poses a problem for a variable gain power amplifier: unless the characteristics of the impedance matching network can be made to vary with the amplifier's output power level, some degree of impedance mismatch is inevitable at all but one level. The present invention solves this problem by providing a variable impedance network which comprises a number of individual impedance matching networks, which either singly or in combination provide proper impedance matching for a particular output power level, with the amplifier's output or outputs (as for the variable gain power amplifier discussed above) connected to appropriate impedance matching networks with MEM switches.

Figure 2:
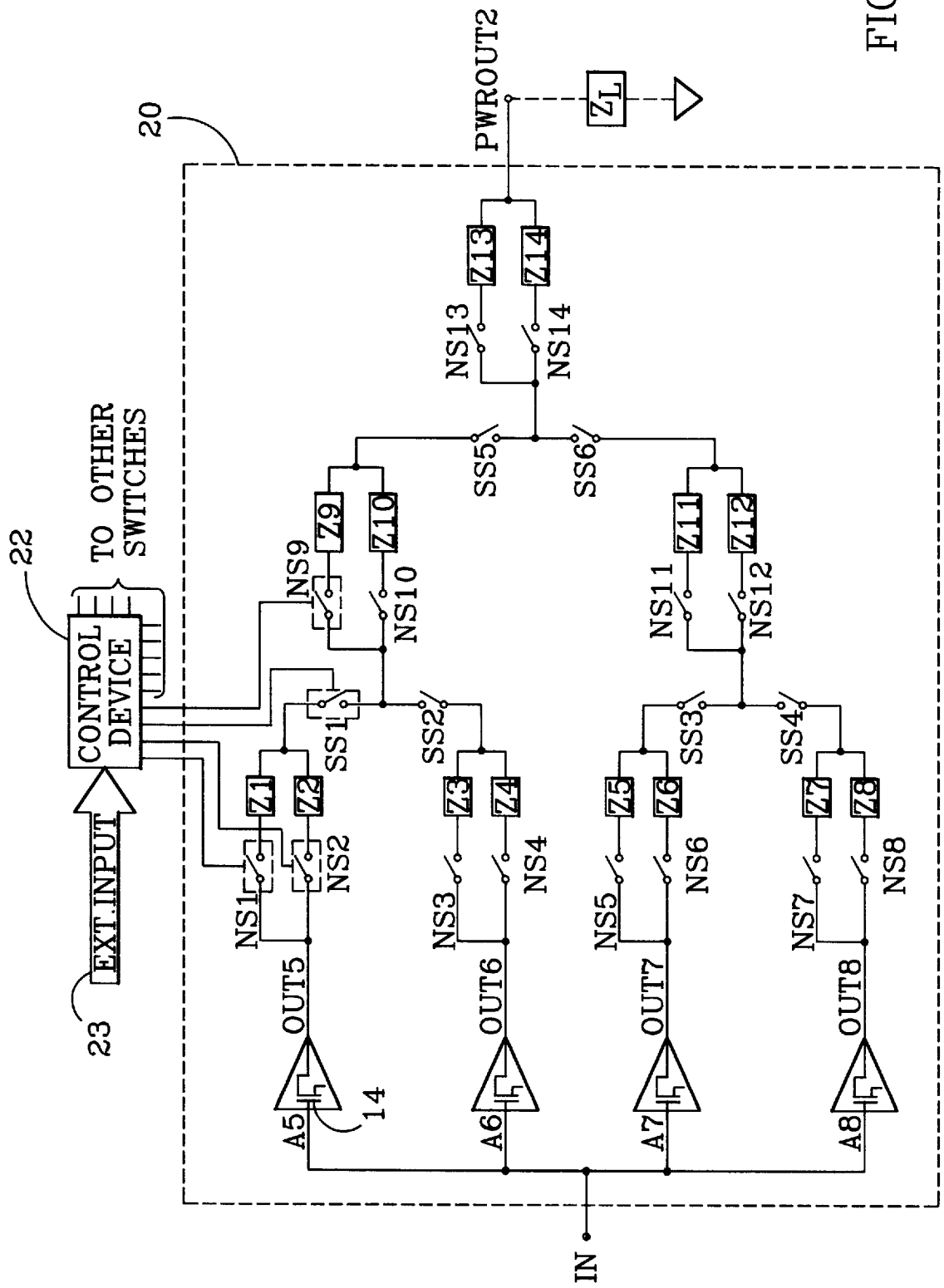
FIG. 2 is a schematic diagram of an embodiment of the present invention which includes variable impedance matching.

The addition of variable impedance matching to a variable gain power amplifier per the present invention is shown in FIG. 2, which depicts a four-stage power amplifier 20 with both features. Amplifier stages A5, A6, A7 and A8 each receive a common input signal IN and produce respective outputs OUT5, OUT6, OUT7 and OUT8. The stages are each preferably built around a microwave frequency active device such as an HBT 12 (as shown in FIG. 1) or a PHEMT 14 (as shown in FIG. 2). OUT5 is connected to a pair of "network select" (NS) switches NS1 and NS2, which direct OUT5 to the input side of one of two impedance matching networks Z1 and Z2. Typically, only one of the two network select switches NS1, NS2 is closed at any one time, so that OUT5 is directed through Z1 or Z2. However, both NS1 and NS2 could be closed to present an impedance comprising the parallel combination of Z1 and Z2 to OUT5. Similarly, OUT6 is connected to the input sides of impedance networks Z3 and Z4 via switches NS3 and NS4, OUT7 is connected to networks Z5 and Z6 via switches NS5 and NS6, and OUT8 is connected to networks Z7 and Z8 via switches NS7 and NS8.

The output sides of networks Z1 and Z2 are connected together and fed to one side of a "stage select" (SS) switch SS1. Similarly, networks Z3 and Z4 connect to switch SS2, networks Z5 and Z6 connect to switch SS3 and networks Z7 and Z8 connect to switch SS4.

The other sides of stage select switches SS1 and SS2 are connected together and fed to another pair of network select switches NS9 and NS10, which direct an incoming signal to one, two or both of impedance networks Z9 and Z10. Similarly, the other sides of stage select switches SS3 and SS4 are connected together and fed to a pair of network select switches NS11 and NS12, which direct an incoming signal to impedance networks Z11 and Z12.

The output sides of networks Z9 and Z10 are connected together and fed to one side of a stage select switch SS5, and Z11 and Z12 are connected to a stage select switch SS6. The other sides of SS5 and SS6 are connected together and fed to a pair of network select switches NS13 and NS14 which are connected to impedance networks Z13 and Z14. The output sides of networks Z13 and Z14 are connected together and this junction forms the output PRWOUT2 of the power amplifier 20, which is shown driving a load having an impedance $Z_L$.

The gain and impedance matching of the power amplifier 20 shown in FIG. 2 are controlled by the switching network formed by all the network select and stage select switches. The overall gain $G_{TOTAL}$ of amplifier 20 is varied by causing stage select switches to close as needed to provide the desired gain value. For example, assume that each of the stages A1, A2, A3 and A4 has a gain of about G. Amplifier 20 provides a gain of G if SS1 and SS5 are closed and all other stage select switches are open. The same result is obtained if SS2 and SS5 are closed (with all other stage select switches open), or if either SS3 or SS4 is closed in conjunction with SS6. Gains of 2G, 3G and 4G are obtained by closing two, three or four of stage select switches SS1–SS4. If either SS1 or SS2 are closed, SS5 must also be closed to provide a signal path between A1 (via SS1) or A2 (via SS2) and the load, and SS6 must be closed whenever SS3 or SS4 are closed. As with the embodiment of FIG. 1, the switching network is preferably controlled with a control device 22 which is connected to each stage select and network select switch. FIG. 2 depicts a control device 22 connected to deliver an actuation voltage to switches NS1, NS2, NS9 and SS1; all other MEM switches are similarly connected to and controlled by the control device 22 (connections not shown for clarity). The control device would typically operate the switches in response to some external input 23, such as a signal or signals from other circuitry, or a manual input, for example. The external input 23 preferably represents a particular desired power output level, and the control device 22 is configured or programmed to close switches as necessary to achieve the desired output level and to provide proper impedance matching for that output level.

The appropriate impedance matching networks are connected into the signal path(s) between the stages and the load using the various network select switches. For example, if A1 is to be contributing a share of the power amplifier's output and A2 is not (i.e., SS1 closed and SS2 open), network Z1 would be switched in by closing NS1 (with NS2 open). If both A1 and A2 are providing output power, Z2 and Z4 are selected by closing NS2 and NS4, respectively (and opening NS1 and NS3). Networks Z5/Z6 and Z7/Z8 are selected in similar fashion, depending on whether one or both of A3 and A4 are providing output power. If any stage is not contributing to the power amplifier's output, the position of its network select switches is not important. The next level of impedance networks Z9, Z10, Z11 and Z12 are operated the same way. Network select switches NS9, NS10, NS11 and NS12 connect incoming signals to Z9, Z10, Z11 and Z12 as necessary to maintain proper matching between the selected stages and the load.

The last level of impedance networks Z13 and Z14 is only needed if there is another grouping of amplifier stages in parallel with four-stage power amplifier 20 which receives the same input signal IN, with one of Z13 or Z14 selected if the other grouping is contributing to the overall output, and the other of Z13 or Z14 selected if it is not.

If the gain of each of the amplifier stages A5–A8 is about equal, the configuration of impedance networks and switches shown provides the flexibility needed to provide proper impedance matching for each possible power output level. For this configuration, the impedance values for Z1, Z3, Z5 and Z7 would typically be about equal, and similarly, Z2, Z4, Z6 and Z8 would be about equal (but not equal to Z1, Z3, Z5 and Z7). For the next level of networks, Z9 and Z11 would be about equal, and Z10 and Z12 would be about equal (but not equal to Z9 and Z11).

When the gains of the respective amplifier stages are not equal, as many as $2^X+1$ power levels are possible (with X equal to the number of individual stages). Additional power levels can be accommodated by adding additional impedance matching networks and switches to the circuit, configured as needed to provide proper matching at each possible output power level.

The configuration and values of the components that make up a "properly designed" impedance matching network, which typically comprises a combination of inductors, capacitors and resistors, are determined by methods well-known in the field, and are discussed, for example, in Krauss and Bostian, *Solid State Radio Engineering,* supra, pp. 417–429.

The preferred MEM switch is a SPST switch which can be integrated with the active devices making up the amplifier stages. Being limited to SPST switches necessitates the use of two individual switches to select between a pair of impedance networks, as NS1 and NS2 do in FIG. 2. A number of switches could be eliminated by replacing two SPST switches with a single SPDT switch. However, there are no known MEM-type SPDT switches currently available which can be integrated with microwave frequency active devices.

Figure 3:
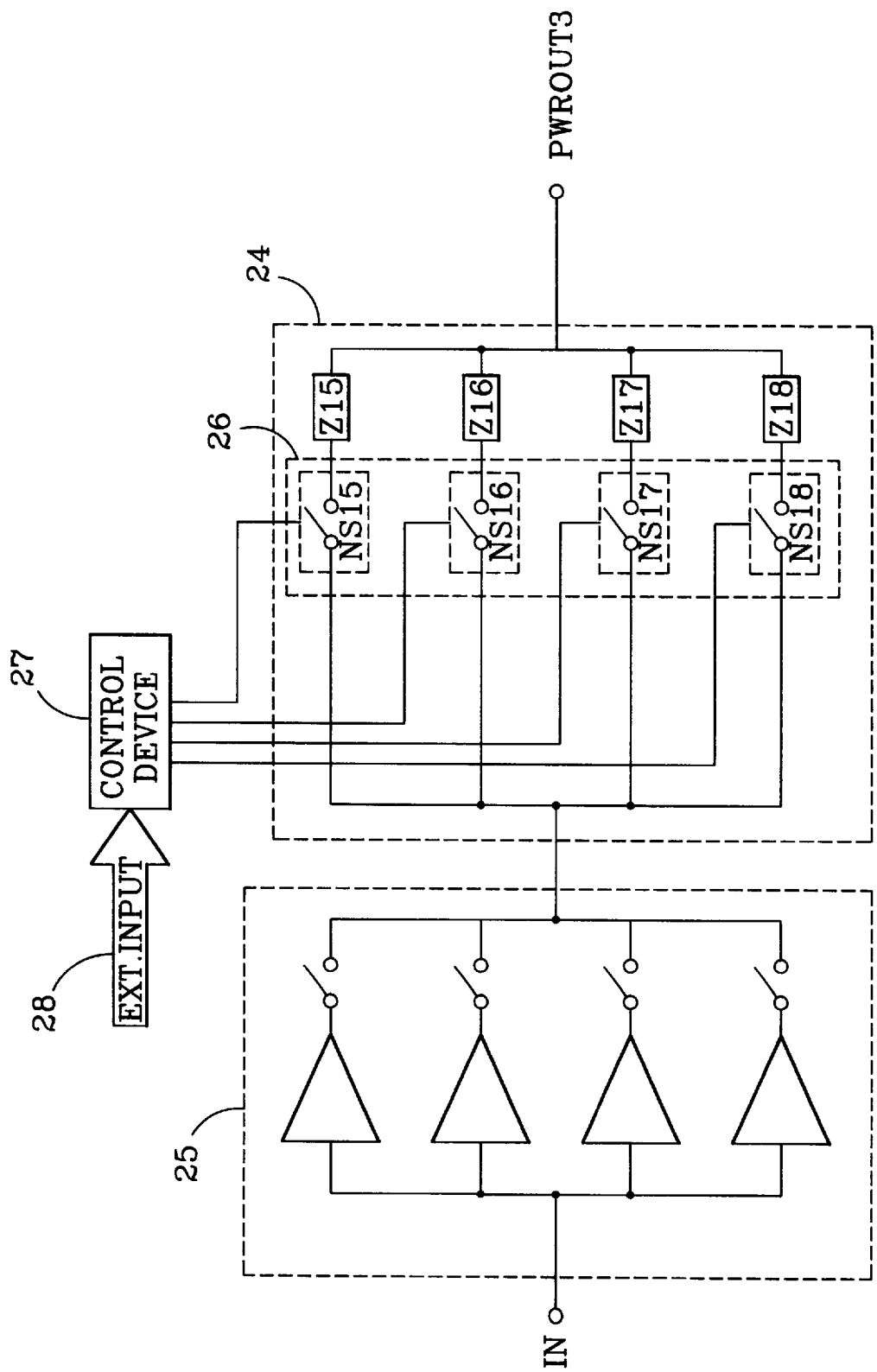
FIG. 3 is a schematic diagram of a variable impedance matching network per the present invention.

A variable impedance network per the present invention may be incorporated as an integral part of a variable gain power amplifier as discussed above and shown in FIG. 2, or may be configured as a separate circuit which can be added to the output of a variable gain amplifier. In FIG. 3, a variable impedance network 24 is connected to the output of a variable gain power amplifier 25. Variable impedance network 24 comprises impedance matching networks Z15–Z18 and a switching network 26 including switches NS15–NS18, which direct the amplifier's output to appropriate matching networks and produce impedance matched output PWROUT3. Depending on the configuration of the switches, the output signal can be directed to any single matching network or to a combination of matching networks. The number of matching networks, the impedance values of the respective matching networks, and the particular configuration of matching networks are determined based on system requirements, such as the number of discrete output power levels which can be delivered by the amplifier whose output is being matched, the degree of mismatch which is tolerable, and space and power limitations. The variable impedance network 24 is preferably controlled by a control device 27, which causes network select switches NS15–NS18 to be operated as necessary to provide a desired impedance match. The control device, such as a microprocessor or a logic circuit, for example, would typically operate the switches in response to an external input 28, such as a signal from another circuit or a manual input, which represents the output power level being delivered by the amplifier 25.

The configuration of FIG. 3 may also be realized with a single multiple-pole switch in place of NS15–NS18. However, there is currently no known switch of this type which can be integrated with microwave frequency active devices on a common substrate, thus necessitating the use of an off-chip switch. As noted above, parasitic capacitances arising from connections to off-chip switches limit the usable frequency range of the amplifier; thus, use of an off-chip multiple-pole switch to connect between impedance matching networks, though providing some functionality, is not recommended.

The variable impedance networks shown in FIGS. 2 and 3 are intended to be merely illustrative, demonstrating the design flexibility afforded by the invention. The specific design of the impedance networks, the number of matching networks, and their interconnection topology are determined by the requirements of a particular system. A variable impedance network need not be integrated on the same substrate as the variable gain amplifier it is used with, but integrating the entire system on a common substrate is preferred, since doing so reduces parasitic capacitances caused by interconnections between separate dies, reduces I.C. size, and increases reliability.

As noted above, the invention can be implemented with a variety of substrate materials and active device types, and its advantages are best realized when handling signals at microwave frequencies and above. A monolithic microwave integrated circuit (MMIC) is an I.C. in which microwave frequency active devices are integrated with passive components to perform a specific circuit function. A key advantage presented by the invention is the ability to integrate the individual amplifier stages, including microwave frequency active devices and their associated passive components (referred to herein as "MMIC components"), with high performance MEM switches on a common substrate, using MMIC fabrication processes. MMIC fabrication techniques are well-known, and are discussed, for example, in C. T. Wang, *Introduction to Semiconductor Technology,* supra, pp. 187–195 (active devices) and pp. 422–433 (passive components).

An integrated microwave frequency variable gain power amplifier per the present invention is preferably fabricated on a semi-insulating substrate, preferably comprising GaAs. Use of a semi-insulating substrate provides two advantages: capacitive coupling between signal lines is lower for a semi-insulating substrate than for a semi-conductive silicon substrate, and integration with MMIC components, which are typically fabricated on a semi-insulating GaAs substrate, is made possible.

When fabricating a conventional MMIC, the active devices are fabricated using MMIC fabrication processes, followed by the fabrication of the passive components and the concurrent deposition and patterning of metal interconnecting runs ("runs") which connect the circuit elements together. The invention utilizes the processing steps that create the runs to concurrently fabricate the preferred MEM switches and to interconnect the switches and active devices with other circuitry. Plan views of a fabrication sequence showing the integration of an active device and a MEM switch are shown in FIGS. 4a–11a and corresponding sectional views are shown in FIGS. 4b–11b. The steps described and shown are intended only to illustrate the process sequence—they are not intended to depict the implementation of a particular function or amplifier. However, the process of simultaneously building up both the MEM switches and the interconnecting runs shown in FIGS. 4–11 may be extended as necessary to produce functional circuits.

As shown in FIGS. 4a and 4b, transistors 29 (shown schematically in FIG. 4a; not shown elsewhere for clarity), preferably HBTs or PHEMTs, are fabricated on a substrate 30, preferably a semi-insulating GaAs substrate, producing associated connection pads 32 on the substrate surface. A first metal layer is then deposited on the substrate and patterned (FIGS. 5a and 5b), which serves to provide interconnecting metal runs 33, to create (and interconnect to) bottom electrodes 34 of the preferred MEM switch, and to create a gapped signal line 36. (Interconnecting metal runs are not shown in the sectional views for clarity).

A sacrificial layer 38, preferably polyimide, is then casted over the entire wafer (FIGS. 6a and 6b). In FIGS. 7a and 7b, holes are created in the sacrificial layer 38 using photolithography or etching to form anchor points 40 for the cantilever arm of the MEM switch, and vias 42 to the transistor connection pads and for air bridges (discussed below). A second layer of metal is deposited and patterned (FIGS. 8a and 8b) to create a contact electrode 44 for the MEM switch, contacts 46 to the connection pads 32, and a second level of interconnecting runs with air bridges 48 used as necessary to cross over interconnecting runs from the first metal layer (rightmost air bridge not shown in FIG. 8b for clarity). The spans 49 of the air bridges and the contact electrode 44 will be atop the sacrificial layer, typically about equidistant from the substrate surface. Air bridges are commonly found on MMICs to enable one signal line to cross over another without creating a short circuit, and are preferred because their low dielectric constant (~1) does not adversely affect signal speed. Air bridges are discussed, for example, in Licari and Enlow, *Hybrid Microcircuit Technology Handbook,* Noyes Publications (1988), pp. 76–77.

Thus far, the bottom electrode 34, the signal line 36, the contact electrode 44 and the anchor points 40 of the MEM switch have been formed and interconnected to the MMIC components using only standard MMIC processing steps performed whenever interconnecting metal runs are made on a MMIC.

In FIGS. 9a and 9a, a dielectric material, preferably a layer of silicon dioxide ($SiO_2$) about 2 $\mu$m thick, is deposited and patterned to form the cantilever arm 50 of the MEM switch. The deposition is preferably a plasma enhanced chemical vapor deposition (PECVD) performed at a low process temperature of about 250° C. A third layer of metal is deposited and patterned (FIGS. 10a and 10b) to create and interconnect the top electrodes 52 of the MEM switch. An isotropic etching step, preferably using an oxygen plasma, is used to remove the sacrificial layer 38 to complete the fabrication of both the MEM switch and the air bridges (FIGS. 11a and 11b). The MEM switch is now fully integrated with an active device. The entire integration requires only two more masking levels (one for cantilever arm 50 and one for top electrodes 52) than are ordinarily required, and the low process temperature budget of 250° C. ensures the MEM switch's monolithic integration capability with the MMIC components. The first two metal layers are preferably gold, and the third layer (creating top electrode 52), is preferably aluminum.

The MEM switch depicted in FIGS. 4–11 represents only one possible configuration of such a switch. The anchor structure, cantilever arm, and metal contacts may be formed in various geometries and using various materials as appropriate for a given end use. However, the low loss and high isolation characteristics provided by using a movable metal contact to make an electrical connection is essential to realize the benefits of the invention herein claimed.

Passive components which form the individual amplifier stages in conjunction with the microwave transistors are preferably fabricated on the same substrate as the microwave transistors and the MEM switches. They are built up on the substrate surface and interconnected to in the course of performing the sequence of processing steps depicted in FIGS. 4–11.

Passive components which make up an impedance network (if any) are similarly built up on a common substrate with their associated MEM switches, and the common substrate may also contain a variable gain power amplifier. If the variable impedance network and the variable gain power amplifier are built on separate substrates, connections must be made between amplifier and the impedance networks, using wire bonds, for example. Fabrication of passive devices for use in MMICs and impedance matching networks is discussed, for example, in C. T. Wang, *Introduction to Semiconductor Technology,* supra, pp. 422–433.

For reasons noted above, it is preferred that the switching network and active devices be integrated together on a common substrate. However, it is not essential that the invention be implemented this way. For example, the switching network may be fabricated on a separate die and interconnected to the amplifier stages via wire bonds. This approach permits the switching network and amplifier stages to be fabricated using different substrate materials and processing steps.

Though the integration of a MEM switch and an active device on a common substrate was illustrated with a GaAs substrate and a microwave frequency active device in FIGS. 4–11, other combinations of substrate and active device are similarly implemented. For example, MEM switches and CMOS or bipolar transistors can be fabricated on a common silicon substrate using common processing steps in the same manner as that illustrated.

An integrated microwave frequency power amplifier built as described herein provides previously unattainable levels of performance. The gain range possible is nearly unlimited due to the very low insertion loss and excellent isolation characteristics of the preferred switches. For example, a 4-stage amplifier in which the active device for each stage is a 3 watt HBT, provides output power levels of 3, 6, 9 and 12 watts at frequencies as high as about 10 GHz. A similar power amplifier based on 0.1 watt PHEMTs gives power levels of 0.1, 0.2, 0.3 and 0.4 watts at frequencies of up to 44 GHz. Combining additional stages in parallel enables the creation of power amplifiers with much higher power levels, practically limited only by the voltage and current capabilities of the amplifier's power source.

While particular embodiments of the invention have been shown and described, numerous variations and alternate embodiments will occur to those skilled in the art. Accordingly, it is intended that the invention be limited only in terms of the appended claims.

We claim:

1. An integrated, variable gain power amplifier, comprising:

a plurality of amplifier stages which have a common input and respective outputs, and a switching network which is operable to include selectable ones of said amplifier stages in contributing to a power amplifier output, said power amplifier output having a variable gain that depends upon the selected amplifier stages, said switching network comprising a plurality of micro-electromechanical (MEM) switches integrated with said amplifier stages on a common substrate, said MEM switches providing lower insertion losses and thereby higher amplifier efficiency than would be provided by similarly employed solid state switches.

2. The power amplifier of claim 1, wherein said common substrate is a semi-insulating gallium arsenide (GaAs) substrate.

3. The power amplifier of claim 1, wherein said common substrate is silicon.

4. An integrated, variable gain power amplifier, comprising:

a plurality of amplifier stages which have a common input and respective outputs, a switching network which is operable to include selectable ones of said amplifier stages in contributing to a power amplifier output, said power amplifier output having a variable gain that depends upon the selected amplifier stages, and a variable impedance network for said amplifier stages, said switching network being operable to vary the effective output impedance of said variable impedance network in accordance with the selected amplifier stages to provide impedance matching for said selected stages.

5. The power amplifier of claim 4, wherein said variable impedance network is integrated with said amplifier stages and said switching network on a common substrate.

6. The power amplifier of claim 4, wherein said variable impedance network comprises a plurality of individual impedance matching networks, said switching network operable to direct said stage outputs through selected impedance matching networks to provide impedance matching for said selected stages in accordance with the selected amplifier stages.

7. The power amplifier of claim 1, wherein each of said amplifier stages comprises at least one heterojunction bipolar transistor (HBT).

8. The power amplifier of claim 1, wherein each of said amplifier stages comprises at least one pseudomorphic high electron mobility transistor (PHEMT).

9. The power amplifier of claim 1, wherein each of said amplifier stages comprises at least one bipolar junction transistor (BJT).

10. The power amplifier of claim 1, wherein each of said amplifier stages comprises at least one FET.

11. The power amplifier of claim 1, wherein said power amplifier comprises at least four amplifier stages such that said power amplifier has at least five possible output power levels that are selectable with said switching network.

12. The power amplifier of claim 1, further comprising a control device connected to said switching network and arranged to operate said network in response to an external input.

13. The power amplifier of claim 12, wherein said switching network comprises a plurality of switches, each of said plurality of switches connected to said control device and arranged to operate in response to an actuation voltage received from said control device.

14. The power amplifier of claim 1, wherein said amplifier stages are designed to amplify input signals at frequencies of about 900 MHz and above.

15. An integrated, variable gain power amplifier with variable impedance matching, comprising:

a plurality of amplifier stages which have a common input and respective outputs, a plurality of impedance matching networks, and a plurality of switches operable to interconnect the respective outputs of said stages together to provide a gain for said common input signal which varies with the number of said interconnected outputs, and to interconnect said impedance matching networks to the outputs of said stages such that output power is efficiently transferred from said stages to a load.

16. The power amplifier of claim 15, wherein said amplifier stages, impedance matching networks and switches are integrated on a common substrate.

17. The power amplifier of claim 16, wherein said common substrate is a semi-insulating gallium arsenide (GaAs) substrate.

18. The power amplifier of claim 16, wherein said common substrate is silicon.

19. The power amplifier of claim 15, wherein each of said amplifier stages includes at least one heterojunction bipolar transistor (HBT) and is arranged to amplify a microwave frequency input signal.

20. The power amplifier of claim 15, wherein each of said amplifier stages includes at least one pseudomorphic high electron mobility transistor (PHEMT) and is arranged to amplify a millimeter wave frequency input signal.

21. The power amplifier of claim 15, wherein each of said amplifier stages includes at least one bipolar junction transistor (BJT).

22. The power amplifier of claim 15, wherein each of said amplifier stages includes at least one FET.

23. The power amplifier of claim 15, wherein the gain of each of said amplifier stages is about equal so that the overall gain of said power amplifier is about equal to the common gain value multiplied by the number of stages interconnected together with said switches.

24. The power amplifier of claim 15, wherein said plurality of amplifier stages comprises X stages and each of said stages has a unique gain value, said switches operable to interconnect said stages to provide an overall gain for said power amplifier from among $2^x$ possible gain values.

25. The power amplifier of claim 15, wherein said switches are operable to interconnect said plurality of impedance matching networks to provide proper impedance matching for each of said power amplifier's possible gain values.

26. The power amplifier of claim 15, wherein said switches are micro-electromechanical (MEM) switches.

27. The power amplifier of claim 15, further comprising a control device connected to said plurality of switches and arranged to operate said switches in response to an external input.

28. The power amplifier of claim 15, wherein said amplifier stages are designed to amplify input signals at frequencies of about 900 MHz and above.

29. A variable impedance network, comprising:

a plurality of impedance matching networks, each of said impedance matching networks comprising at least one integrated reactive component, and a switching network comprising a plurality of integrated micro-electro mechanical (MEM) switches, said switching network connected to said matching networks and operable to vary the effective output impedance presented to an amplifier output connected to said switching network in accordance with the amplifier's output power level to provide impedance matching for said amplifier, said impedance matching networks and said switching network integrated together on a common substrate, said MEM switches providing lower insertion losses and thereby higher amplifier efficiency than would be provided by other types of similarly employed integratable switches.

30. The variable impedance network of claim 29, further comprising a control device connected to said switching network and arranged to operate said network in response to an external input.

31. The variable impedance network of claim 29, further comprising a variable gain amplifier having an output which is connected to said variable impedance network, said amplifier output being impedance matched by said variable impedance network.

32. The variable impedance network of claim 31, wherein said plurality of impedance matching networks and said switching network are arranged such that said switching network is operable to interconnect said matching networks to provide proper impedance matching for each of said variable gain amplifier's possible gain values.

33. A method of varying the matching impedance presented to the output of a variable gain amplifier, comprising the steps of:

determining a proper matching impedance for a particular output power level produced by a variable gain amplifier, operating a switching network comprising integrated micro-electro mechanical (MEM) switches to direct the output of said amplifier to selected impedance matching networks to vary the effective impedance presented to said amplifier in accordance with said output power level to achieve said proper matching impedance, each of said impedance matching networks comprising at least one reactive component which is integrated with said switching network on a common substrate.

34. The method of claim 33, wherein said step of determining a proper matching impedance is performed by a control device arranged to operate said switching network in response to an external input.

35. The power amplifier of claim 1, further comprising at least one impedance matching network connected to the output of at least one of said amplifier stages, said at least one impedance matching network integrated with said amplifier stages and said switching network on a common substrate.

* * * * *